(12) United States Patent
Kurihara et al.

(10) Patent No.: US 7,884,397 B2
(45) Date of Patent: Feb. 8, 2011

(54) SOLID-STATE IMAGE SENSOR AND METHOD FOR PRODUCING THE SAME

(75) Inventors: Masaaki Kurihara, Tokyo (JP); Makoto Abe, Tokyo (JP); Katsutoshi Suzuki, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 863 days.

(21) Appl. No.: 11/527,032

(22) Filed: Sep. 26, 2006

(65) Prior Publication Data
US 2007/0080375 A1    Apr. 12, 2007

(30) Foreign Application Priority Data
Sep. 27, 2005  (JP)  ............... 2005-279560

(51) Int. Cl.
*H01L 27/148*  (2006.01)
(52) U.S. Cl. ............... 257/232; 257/E31.127; 438/69
(58) Field of Classification Search .......... 257/E31.127, 257/232; 438/69
See application file for complete search history.

(56) References Cited

U.S. PATENT DOCUMENTS

| | | | |
|---|---|---|---|
| 5,497,269 A * | 3/1996 | Gal ............ | 359/615 |
| 6,421,105 B1 * | 7/2002 | Shieh et al. .......... | 349/95 |
| 2001/0026322 A1 * | 10/2001 | Takahashi et al. ........... | 348/340 |

FOREIGN PATENT DOCUMENTS

| | | |
|---|---|---|
| JP | 63-100879 | 5/1988 |
| JP | 2005-150492 | 6/2005 |

* cited by examiner

Primary Examiner—Thao X Le
Assistant Examiner—Matthew Gordon
(74) Attorney, Agent, or Firm—Ladas & Parry LLP

(57) ABSTRACT

A main object of the present invention is to provide a solid-state image sensor capable of efficiently collecting a light beam when the central position of the light receiving element and the central position of the micro lens do not coincide with each other in the plan view owing to a plural pixel sharing structure. To achieve the object, the present invention provides a solid-state image sensor comprising at least: a light receiving element for receiving a subject light to convert into a light signal; a micro lens for improving the light collecting rate to the light receiving element; and a signal readout circuit for reading a light signal generated from the light receiving element, such that the central position of the light receiving element and the central position of the micro lens do not coincide with each other in the plan view for having a plural pixel sharing structure with the single signal readout circuit shared by a plurality of the light receiving elements, wherein the micro lens having the maximum film thickness position different from the central position is provided such that the focus position of the micro lens with respect to a parallel ray is on the light receiving element.

4 Claims, 4 Drawing Sheets

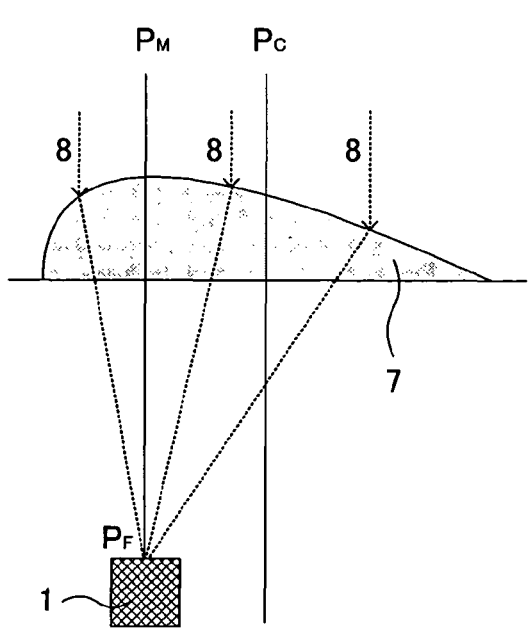 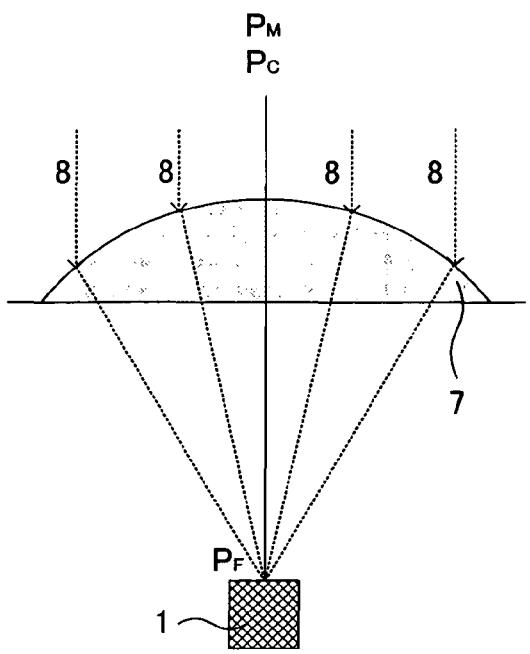
FIG. 5A                FIG. 5B
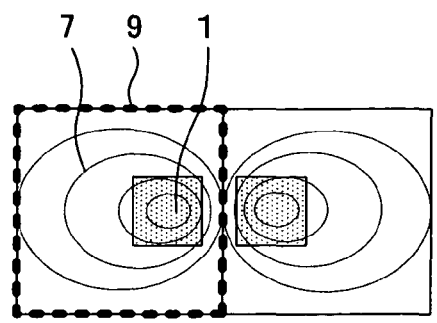 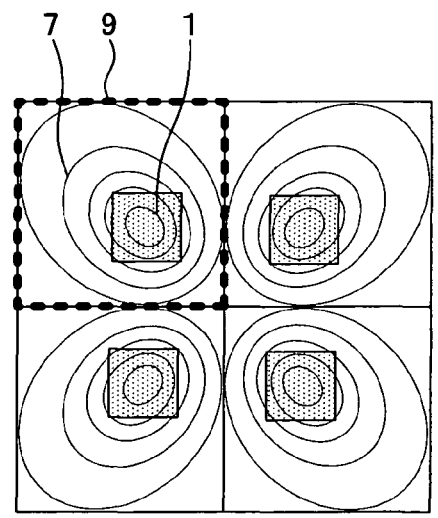
FIG. 6A                FIG. 6B

SOLID-STATE IMAGE SENSOR AND METHOD FOR PRODUCING THE SAME

BACKGROUND OF THE INVENTION

1. Field of the Invention

The present invention relates to a solid-state image sensor having a good light collection efficiency, and a method for producing the same.

2. Description of the related Art

Recently, the main body of a digital camera spreading rapidly has a solid-state image sensor for converting a subject light to be picked up into a light signal for recording, such as a CCD (Charge Coupled Device) or a CMOS (Complementary Metal Oxide Semiconductor) sensor assembled. Such a solid-state image sensor in general comprises a light receiving eminent for receiving a subject light to be picked up and converting-the same into a photoelectric signal, a color filter formed on the light receiving element, and a micro lens for improving the light collecting rate to the light receiving element.

In general, the CMOS sensor comprises a signal readout circuit such as a signal amplifier transistor, corresponding to each light receiving element (photo diode) for receiving a light beam to convert the same into a light signal. However, recently, for the purpose of restraining the signal noise or achieving the high integration, a CMOS sensor comprising a signal readout circuit provided commonly for a plurality of light receiving elements called a plural pixel sharing structure is proposed (see Japanese Patent Application Laid-Open (JP-A) No. 1988-100879).

According to a solid-state image sensor comprising such a plural pixel sharing structure, a certain limitation may be generated in terms of the arrangement of a gate electrode and a wiring for achieving such as a high integration. From the configuration structure, the central position of a micro lens (or a pixel area) and the central position of a light receiving element may not coincide in the plan view in some cases. Furthermore, since the displacement degree differs depending on each pixel area, a problem may be generated in that the same light collection cannot be obtained among the pixels for an oblique light beam, or the like. With the light collection difference between the pixels, since it appears as the signal output difference, it may become the factor of generating a noise due to the output irregularity. Moreover, by the oblique light beam, a signal output difference may be generated between the pixel central part of each pixel area and the peripheral part thereof so as to lower the signal output of the peripheral part compared with the pixel central part. Such a signal output difference causes shading on the output screen of an image.

For the above-mentioned problems, JP-A No. 2005-150492 discloses a solid-state image sensor having the interface between an interlayer insulating layer and a protection layer provided with an inclination according to the displacement amount of the plane position between the light receiving sensor part and the micro lens. Although the image sensor improves the light collection efficiency utilizing the refractive index difference between the interlayer insulating layer and the protection layer, since a process of cutting the interlayer insulating layer is provided additionally, a problem of the process complication is involved.

In view of the above-mentioned problems, a solid-state image sensor capable of solving the problems of such as the noise generation or shading by avoiding generation of such as the light collection difference between the pixels or signal output difference even when the central position of the micro lens and the central position of the light receiving element do not coincide with each other in the plan view; and a method for producing a solid-state image sensor, capable of obtaining such a solid-state image sensor by a simple method, are desired.

SUMMARY OF THE INVENTION

The present invention is achieved in view of the above-mentioned circumstances, and a main object thereof it to provide a solid-state image sensor capable of efficiently collecting a light beam when the central position of the light receiving element and the central position of the micro lens do not coincide with each other in the plan view owing to a plural pixel sharing structure.

To achieve the object, the present invention provides a solid-state image sensor comprising at least: a light receiving element for receiving a subject light to be picked up and converting the same into a light signal; a micro lens for improving the light collecting rate to the light receiving element; and a signal readout circuit for reading a light signal generated from the light receiving element, such that the central position of the light receiving element and the central position of the micro lens do not coincide with each other in the plan view for having a plural pixel sharing structure with the single signal readout circuit shared by a plurality of the light receiving elements, wherein the micro lens having the maximum film thickness position different from its central position is provided such that the focus position of the micro lens with respect to a parallel ray is on the light receiving element.

According to the present invention, when the central position of the micro lens and the central position of the light receiving element do not coincide with each other in the plan view, by using a micro lens having a predetermined shape, a solid-state image sensor having the excellent light collection efficiency can be provided.

Moreover, according to the above-mentioned invention, it is preferable that the maximum film thickness position of the above-mentioned micro lens is away from the central position by 2% or more with respect to the diameter of the micro lens because a solid-state image sensor having a preferable light collection efficiency can be provided thereby.

Moreover, according to the above-mentioned invention, it is preferable that the above-mentioned plural pixel sharing structure is a two pixel sharing structure or a four pixel sharing structure because it is advantageous in terms of achieving a high integration owing to the good symmetry.

The present invention further provides a method for producing a solid-state image sensor, wherein the central position of the light receiving element and the central position of the micro lens do not coincide with each other in the plan view for having a plural pixel sharing structure with a single signal readout circuit shared by a plurality of the light receiving elements, wherein a micro lens having the maximum film thickness position different from the central position is formed by providing a photosensitive material layer on a solid-state image sensor forming material and carrying out the gray-scale lithography method to the photosensitive material layer such that the focus position of the micro lens with respect to a parallel ray is on the light receiving element.

According to the present invention, by using a gray-scale lithography method, a micro lens having a predetermine shape can be formed by a simple method.

According to the solid-state image sensor of the present invention, when the central position of the micro lens and the central position of the light receiving element do not coincide with each other in the plan view, by providing the micro lens shape different from the shape of the conventional micro lens, the light collection efficiency to the light receiving element can be improved. Therefore, generation of such as the light collection difference or signal output difference between the pixels can be avoided so that reduction of the noise generation, shading, or the like on the output screen of an image can be realized. Furthermore, for example when a plurality of light receiving sensor parts are arranged by a two dimension arrangement in a matrix, by collecting an oblique light beam incident on the micro lens to the light receiving sensor parts, light leakage to the adjacent pixels can be reduced so that the color mixture on the output screen of an image can also be restrained.

BRIEF DESCRIPTION OF THE DRAWINGS

FIGS. 5A and 5B are each an explanatory diagram for explaining the focus position of a micro lens;

FIGS. 6A and 6B are explanatory diagrams for explaining each of the two pixel sharing structure and the four pixel sharing structure.

DETAILED DESCRIPTION OF THE INVENTION

Hereinafter, the solid-state image sensor of the present invention, and the method for producing the solid-state image sensor are explained in detail.

A. Solid-state image sensor

First, the solid-state image sensor of the present invention will be explained. The solid-state image sensor of the present invention comprises at least: a light receiving element for receiving a subject light to be picked up and converting the same into a light signal; a micro lens for improving the light collecting rate to the light receiving element; and a signal readout circuit for reading a light signal generated from the light receiving element, such that the central position of the light receiving element and the central position of the micro lens do not coincide with each other in the plan view for having a plural pixel sharing structure with the single signal readout circuit shared by a plurality of the light receiving elements, wherein the micro lens having the maximum film thickness position different from its central position is provided such that the focus position of the micro lens with respect to a parallel ray is on the light receiving element.

According to the present invention, even when the central position of the micro lens and the central position of the light receiving element do not coincide with each other in the plan view, by using a micro lens having a predetermined shape, a solid-state image sensor having the excellent light collection efficiency can be provided. Moreover, the shape of the micro lens used in the present invention can be determined according to the position of the light receiving element. Therefore, at the time of designing the solid-state image sensor, the position of the light receiving element can be arranged freely to some extent, and thereafter, the shape of the micro lens can be determined according to the position of the light receiving element.

Moreover, the application of the solid-state image sensor of the present invention is not particularly limited, and for example it can be used as a CMOS sensor or a CCD sensor.

Figure 1:
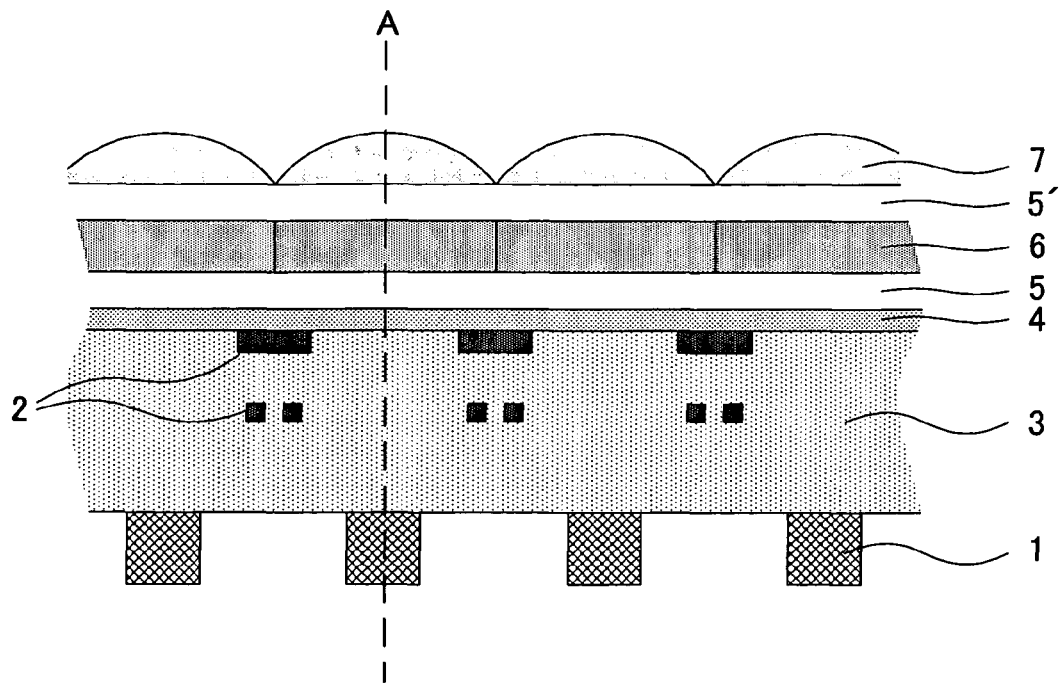
FIG. 1 is a schematic cross-sectional view showing an example of a CMOS sensor having no plural pixel sharing system.

Moreover, the solid-state image sensor of the present invention has the plural pixel sharing structure to be described later. Here, for the comparison, a solid-state image sensor having no plural pixel sharing structure is explained. FIG. 1 is a schematic cross-sectional view showing an example of a CMOS sensor having no plural pixel sharing structure. The CMOS sensor comprises a light receiving element 1, an interlayer insulating layer (interlayer dielectric layer) 3 having a wiring 2 in the inside thereof, a protection layer 4, a first smoothing layer 5, a color filter 6, a second smoothing layer 5' and a micro lens 7 laminated in this order. The micro lens 7 is disposed for each pixel area corresponding to the light receiving element 1 such that the central position of the micro lens 7 and the central position of the light receiving element 1 coincide with each other in the plan view (line segment A in FIG. 1).

Figure 2:
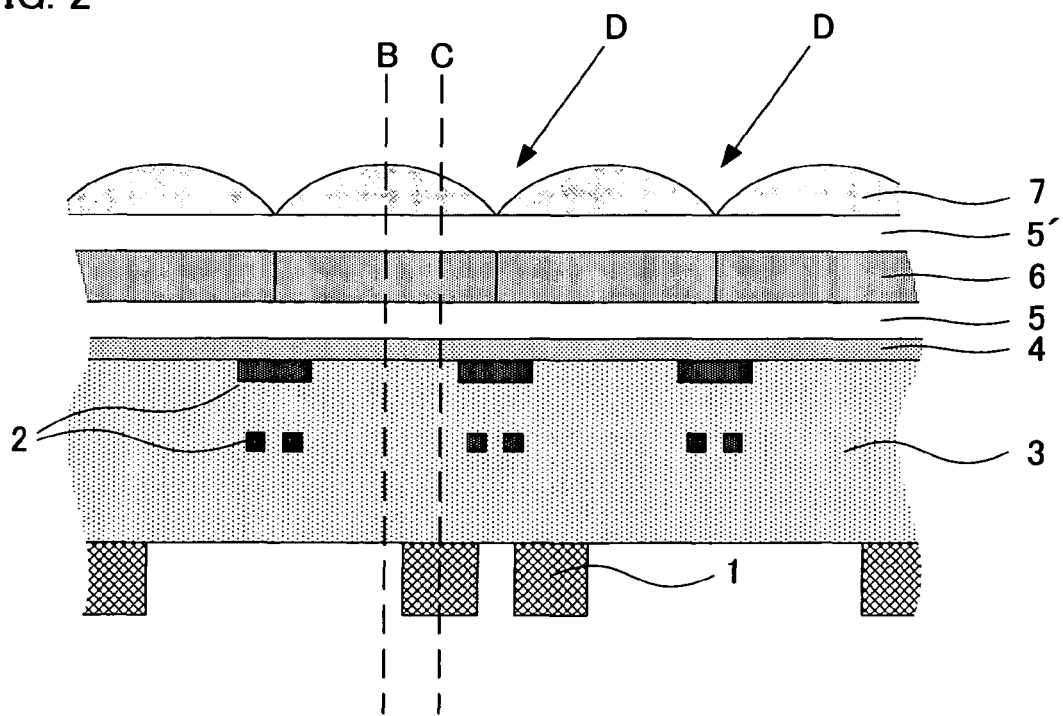
FIG. 2 is a schematic cross-sectional view showing an example of a CMOS sensor having a two pixel sharing structure.

On the other hand, according to the solid-state image sensor having the plural pixel sharing structure, since a plurality of light receiving elements share one signal readout circuit, restraint of the signal noise and achievement of the high integration are aimed at (for example, FIG. 4 of JP-A No. 2005-150492). Therefore, in disposing a gate electrode and a wiring, certain limitation is generated so that the central position of the light receiving element and the central position of the micro lens may not coincide in the plan view in some cases. Specifically, as shown in FIG. 2, the central position of the micro lens 7 (line segment B in FIG. 2) and the central position of the light receiving element 1 (line segment C in FIG. 2) may not coincide in the plan view. In this case, the same light collection may not be obtained among the adjacent pixels with respect to an oblique light beam as shown by the arrow D in FIG. 2. Consequently, the above-mentioned problems of noise generation, shading, or the like may be generated.

Figure 3:
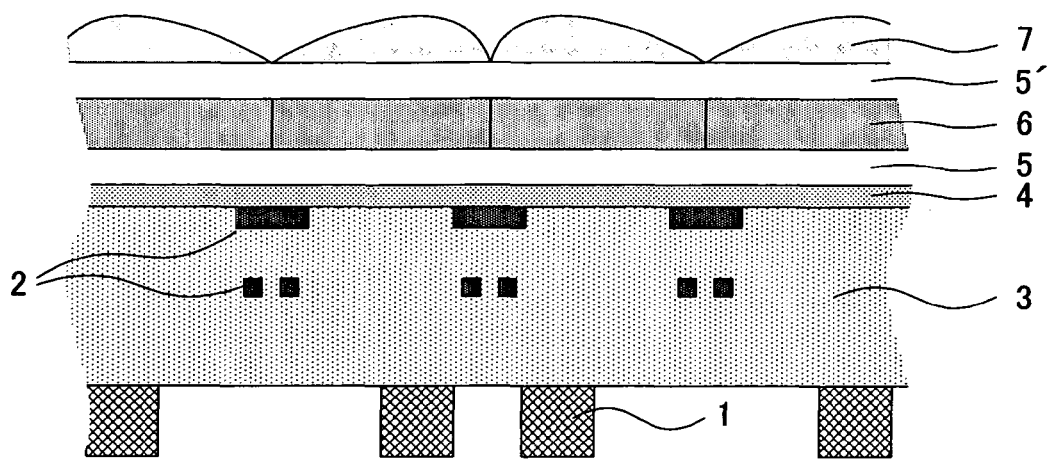
FIG. 3 is a schematic cross-sectional view showing an example of a solid-state image sensor of the present invention.

On the other hand, the solid-state image sensor of the present invention solves the above-mentioned problems by using a micro lens having a predetermined shape. FIG. 3 is a schematic cross-sectional view showing an example of the solid-state image sensor according to the present invention. More specifically, it is a schematic cross-sectional view showing an example of a CMOS sensor having a two pixel sharing structure. The solid-state image sensor comprises a light receiving element 1, an interlayer insulating layer 3 having a wiring 2 in the inside thereof, a protection layer 4, a first smoothing layer 5, a color filter 6, a second smoothing layer 5', and a micro lens 7 laminated in this order. Furthermore, the micro lens 7 has its maximum film thickness position different from its central position such that the focus position of the micro lens 7 with respect to a parallel ray is on the light receiving element 1. The focus position of the micro lens is explained in detail in the "1. Micro lens" to be described later.

The solid-state image sensor of the present invention comprises at least a micro lens, a light receiving element and a signal readout circuit. Hereinafter, each configuration of the solid-state image sensor of the present invention is explained.

1. Micro lens

First, the micro lens used in the present invention is explained. The micro lens used in the present invention is designed such that the maximum film thickness position is different from the central position, and the focus position thereof is in the light receiving element. In the present invention, the "maximum film thickness position" refers to the position where the film thickness of the micro lens is maximum thickness. Moreover, the "central position of the micro lens" refers to the position to be the center of gravity of the contact surface of the micro lens to be contacted with the smoothing layer, or the like.

Figure 4A:
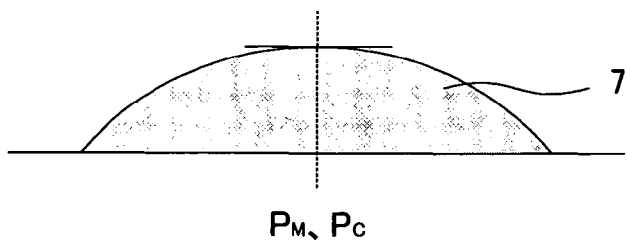
FIGS. 4A and 4B are each an explanatory diagram for explaining the shape of a micro lens.
Figure 4B:
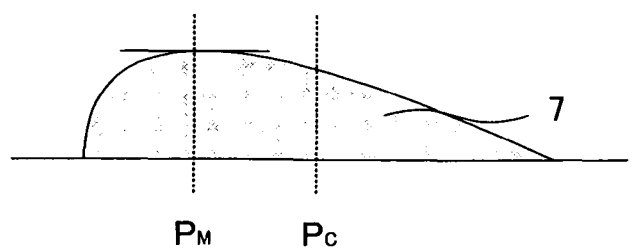

For example as shown in FIG. 4A, the conventional micro lens has the maximum film thickness position $P_M$ coinciding with the central position $P_C$. On the other hand, for example as shown in FIG. 4B, the micro lens used in the present invention has the maximum film thickness position $P_M$ different from the central position $P_C$.

The micro lens used in the present invention is not particularly limited as long as the maximum film thickness position differs from the central position. Specifically, it is preferable that the maximum film thickness position of the micro lens is away from the central position by 2% or more with respect to the diameter of the micro lens, in particular, by 5% or more. This is because a solid-state image sensor having a preferable light collection efficiency can be provided thereby. The "diameter of the micro lens" refers to the length in the diagonal direction of the pixel area (cell).

The maximum film thickness of the above-mentioned micro lends differs depending on such as the pixel size, the shape of the micro lens or the distance between the micro lens and the light receiving element. Specifically, it is preferably in a range of 0.2 to 1.5 µm.

Moreover, the micro lens used in the present invention has the focus position with respect to a parallel ray on the light receiving element. In the present invention, the "focus position" refers to the position whereat a parallel ray refracted by the micro lens is concentrated. Moreover, "on the light receiving element" refers to the region in a range of ±1.5 µm in the optical axis direction from the light receiving surface of the light receiving element. In the present invention, it is preferable that the focus position of the micro lens is the light receiving surface of the light receiving element, and it is particularly preferable that the focus position of the micro lens is the central position of the light receiving surface of the light receiving element. This is because the light receiving efficiency can be improved thereby. The "central position of the light receiving surface" refers to the position to be the center of gravity of the light receiving surface.

Specifically, as shown in FIG. 5A, the micro lens used in the present invention is the micro lens 7 having the maximum film thickness position $P_M$ different from the central position $P_C$, and the focus position $P_F$ with respect to the parallel ray 8 on the light receiving element 1. For example as shown in FIG. 5B, the conventional micro lens is the micro lens 7 having the maximum film thickness position $P_M$ coinciding with the central position $P_C$ so that the focus position $P_F$ with respect to a parallel ray 8 is on the light receiving element 1. When the conventional micro lens is used for a solid-state image sensor with the central position of the light receiving element and the central position of the micro lens not coinciding with each other in the plan view, the focus position of the micro lens may hardly be provided on the light receiving element.

Moreover, the distance between the lower end of the micro lens used in the present invention and the upper end of the light receiving element (light receiving surface) differs depending on such as the kind of the solid-state image sensor of the present invention, and it is for example in a range of 2 to 8 µm.

Moreover, it is preferable that the micro lens used in the present invention does not have a gap between the adjacent micro lenses because the light collection efficiency can be improved thereby. Moreover, the material of the micro lens used in the present invention is not particularly limited; however, it is preferably a material to be used for the gray-scale lithography method to be described later. This is because a micro lens can be formed highly precisely thereby.

2. Light receiving element

Next, the light receiving element used in the present invention is explained. The light receiving element used in the present invention is for receiving a subject light to be picked up and converting the same into a light signal. The light receiving element is not particularly limited, and common light receiving elements can be used. Specifically, a CMOS or a CCD can be used as an example. Additionally, a light collecting lens for a micro device used for such as the optical communication can also be used.

3. Signal readout circuit

Next, the signal readout circuit used in the present invention is explained. The signal readout circuit used in the present invention is for reading the light signal generated from the above-mentioned light receiving element. The signal readout circuit is not particularly limited, and common signal readout circuits can be used. Specifically, a reading gate for reading a charge can be presented as an example.

Moreover, the solid-state image sensor of the present invention has a plural pixel sharing structure for sharing a single signal readout circuit by a plurality of light receiving elements. The above-mentioned plural pixel sharing structure is not particularly limited. Specifically, it is preferably a structure shared by two or more pixels, and it is particularly preferably a two pixel sharing structure or a four pixel sharing structure. This is because they are advantageous for achieving a high integration for the preferably symmetry.

FIG. 6A is a schematic plan view showing an example of a CMOS sensor having a two pixel sharing structure. As shown in FIG. 6A, it is a solid-state image sensor with the central position of the light receiving element 1 and the central position of the micro lens 7 (or the pixel area 9) not coinciding with each other in the plan view for the two pixel sharing structure with the single signal readout circuit (not shown) shared by the two light receiving elements 1. In the present invention, according to the position of the light receiving element 1, the shape of the micro lens 7 is determined. On the other hand, FIG. 6B is a schematic plan view showing an example of a CMOS sensor having a four pixel sharing structure. As shown in FIG. 6B, it is solid-state image sensor with the central position of the light receiving element 1 and the central position of the micro lens 7 (or the pixel area 9) not coinciding with each other in the plan view for the four pixel sharing structure with the single signal readout circuit (not shown) shared by the four light receiving elements 1. In the present invention, according to the position of the light receiving element 1, the shape of the micro lens 7 is determined.

4. Other Members

In addition to the above-mentioned micro lens, light receiving element, and signal readout circuit, the solid-state image sensor of the present invention has other members comprising the solid-state image sensor. As the other members, those used for common solid-state image sensors can be used, and it is not particularly limited. For example, in the case of using the solid-state image sensor of the present invention as a CMOS sensor, as the other members, an interlayer insulating layer (interlayer dielectric layer), a wiring, a protection layer, a smoothing layer or a color filter can be used as an example.

The above-mentioned interlayer insulating layer is provided between the light receiving element and the protection layer. As the material for forming the interlayer insulating layer, for example, a $SiO_2$ can be presented. Moreover, the interlayer insulating layer comprises a wiring for driving such as a gate electrode or a signal readout circuit therein. As the wiring, in general, an Al wiring can be used as an example. Moreover, when the above-mentioned wiring has a multiple layer structure, it is preferable that the above-mentioned interlayer insulating layer has a multiple layer structure as well.

The above-mentioned protection layer is for protecting the interlayer insulating layer and it has a function of facilitating installation of such as a color filter or a micro lens. As the material for forming the protection layer, for example, a P-SiN can be presented.

As the above-mentioned color filter, for example, an on-chip color filter (OCCF) can be presented. Moreover, as the above-mentioned smoothing layer, for example, a resin used for smoothing layers of common solid-state image sensors can be presented.

B. Method for producing a solid-state image sensor

Next, the method for producing a solid-state image sensor of the present invention will be explained. In the method for producing a solid-state image sensor of the present invention, the central position of the light receiving element and the central position of the micro lens do not coincide with each other in the plan view for having a plural pixel sharing structure with a single signal readout circuit shared by a plurality of the light receiving elements, wherein a micro lens having the maximum film thickness position different from the central position is formed by providing a photosensitive material layer on a solid-state image sensor forming material and carrying out the gray-scale lithography method to the photosensitive material layer such that the focus position of the micro lens is on the light receiving element.

According to the present invention, since the gray-scale lithography method is used, a micro lens having a predetermined shape can be formed by a simple method. Specifically, since a micro lens having a predetermined shape can be formed by the ordinary exposure process and developing process except that a special photo mask to be described later is used, a solid-state image sensor having a good light collection efficiency can be obtained by a simple method without the need of the process for cutting an interlayer insulating layer conventionally required.

Moreover, in the present invention, the "gray-scale lithography method" refers to a lithography method using a photo mask for controlling the transmitted light amount (exposure amount) distribution. The photo mask has a minute dot pattern not to be resolved by an exposure wavelength so that the transmitted light amount can be controlled by the density distribution of the dot pattern. Since the portion with a high dot pattern density has a large transmitted light amount and a portion with a low dot pattern density has a small transmitted light amount, by controlling the density distribution, for example a photo mask having the continuous transmitted light amount change can be obtained. In the present invention, the dot pattern density distribution is determined by the preliminary calculation so as to have the focus position of the micro lens is provided on the light receiving element.

Figure 7A:
FIGS. 7A to 7C are a process drawing showing an example of a method for producing a solid-state image sensor of the present invention.
Figure 7B:
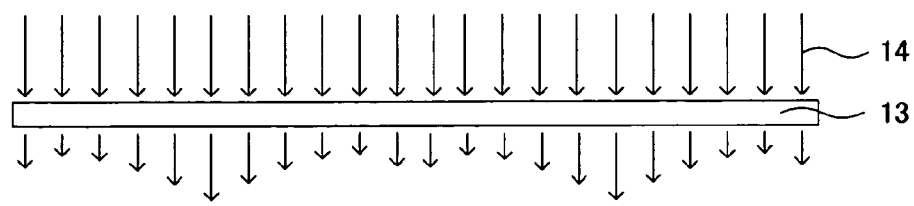
Figure 7C:
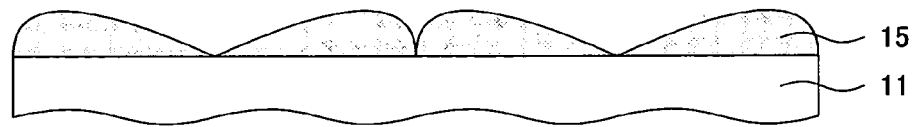

Next, the method for producing a solid-state image sensor of the present invention is explained with reference to the drawings. FIGS. 7A to 7C is a process drawing showing an example of the method for producing a solid-state image sensor of the present invention. First, as shown in FIG. 7A, a photo sensitive material layer 12 is provided on a solid-state image sensor forming material 11. Next, as shown in FIG. 7B, exposure is carried out using a photo mask 13 and a light beam 14 capable of controlling the transmitted light amount distribution. At the time, the photo mask 13 has a dot pattern density distribution so as to have a predetermined micro lens shape. Next, as shown in FIG. 7C, by carrying out the development process and heat treatment, a micro lens 15 is formed.

Hereinafter, the method for producing a solid-state image sensor of the present invention is explained for each configuration.

The solid-state image sensor forming material used in the present invention refers to a solid-state image sensor before formation of the micro lens. The solid-state image sensor forming material comprises at least a light receiving element and a signal readout circuit, wherein the central position of the light receiving element and the central position of the pixel area do not coincide with each other in the plan view for having a plural pixel sharing structure with one signal readout circuit shared by a plurality of light receiving elements.

For example, when the solid-state image sensor obtained by the present invention is a CMOS sensor, a solid-state image sensor forming material, such as comprising a light receiving element, an interlayer insulating layer having a wiring in the inside, a protection layer, a first smoothing layer, a color filter and a second smoothing layer laminated in this order can be used. In this case, the photosensitive material layer to be described later is formed on the second smoothing layer. Since these materials are same as those mentioned in "A. solid-state image sensor", the explanation thereof is omitted here.

Moreover, the photosensitive material layer used in the present invention is a layer to be a micro lens by the exposure process using a photo mask, or the like. The material for the above-mentioned photosensitive material layer is not particularly limited, and for example, a photo resist can be presented. Furthermore, in the present invention, as the above-mentioned photo resist, both a positive type photo resist and a negative type photo resist can be used; however, a positive type photo resist is preferable. As the positive type photo resist, for example, a phenol epoxy resin, an acrylic resin, a polyimide or a cycloolefin can be presented. Specifically, MFR401 produced by JSR Corporation, or THMR P11 produced by TOKYO OHKA KOGYO CO., LTD can be presented as an example.

The method for forming a photosensitive material layer on the solid-state image sensor forming material is not particularly limited, and for example, a spin coating method can be presented.

Moreover, as mentioned above, the photo mask used in the present invention controls the transmitted light amount (exposure amount) distribution at the time of exposing by the density distribution of a minute dot pattern not resolved by an exposure wavelength. By using the above-mentioned photo mask, with an ordinary exposure process, a micro lens having the maximum film thickness position different from the central position and the focus position on the light receiving element can be formed. As a method for forming such a photo mask, for example, the methods disclosed in the JP-A Nos. 2004-70087 and 2004-296290 can be presented.

Moreover, in the present invention, by carrying out such as the development process or heat treatment, after carrying out the exposure using the above-mentioned photo mask, a micro lens can be formed. The methods for the development process and heat treatment are not particularly limited, and common methods can be used.

The present invention is not limited to the above-mentioned embodiments. The above-mentioned embodiments are examples, and thus any one having the substantially same configuration as the technological idea disclosed in the claims of the present invention with the same effects is incorporated in the technological scope of the present invention.

EXAMPLES

Hereinafter, the present invention is explained specifically with reference to the examples.

For confirming the effectiveness of the micro lens used in the present invention, a ray-tracing simulation was carried out in the CMOS sensor structure shown in FIGS. 2 and 3. The simulation conditions are shown in the following table 1.

TABLE 1

Light source incident angle 0°, camera lens F2.4
Micro lens structure

| | Height(μm) | Diameter(μm) | $P_M - P_C$ *1 |
|---|---|---|---|
| Conventional micro lens | 0.5 | 3.1 | 0 |
| Micro lens used in the present invention | 0.5 | 3.1 | 0.37 |

Displacement between the central position of the micro lens 7 and the central position of the light receiving element 1 in the plan view 0.7 μm
CMOS sensor layer structure

| | Refractive index | Film thickness(μm) |
|---|---|---|
| Micro lens 7 | 1.7 | — |
| Second smoothing layer 5' | 1.6 | 0.3 |
| Color filter 6 | 1.6 | 0.9 |
| First smoothing layer 5 | 1.6 | 0.1 |
| Protection layer 4 | 2.0 | 0.2 |
| Interlayer insulating layer 3 | 1.5 | 3.0 |

*1 $P_M - P_C$ is the displacement between the maximum film thickness position ($P_M$) and the central position ($P_C$) in the plan view The light collection efficiency was calculated by the ray-tracing simulation using the above-mentioned conditions so as to obtain the following results. The light collection efficiency here is the value obtained by dividing the light signal incident on the photo diode by the light intensity of the micro lens.

In the case of using the conventional micro lens, the light collection efficiency was 39%, whereas in the case of using the micro lens used in the present invention, the light collection efficiency was 65%.

That is, as the light collection efficiency of the micro lens used in the present invention, the light collection efficiency 1.7 times as much as the conventional micro lens was obtained. From the result, the utilization efficiency of the light incident on the photo diode was improved so that the effectiveness of the micro lens used in the present invention was confirmed.

What is claimed is:

1. A solid-state image sensor comprising at least;
   a light receiving element for receiving a subject light to convert into a light signal;
   a micro lens for improving a light collecting rate to the light receiving element; and
   a signal readout circuit for reading the light signal generated from the light receiving element,
   such that a central position of the light receiving element and a central position of the micro lens do not coincide with each other in a plan view for having a plural pixel sharing structure with the single signal readout circuit shared by a plurality of the light receiving elements,
   wherein the micro lens having maximum film thickness position different from its central position is provided such that a focus position of the micro lens with respect to a parallel ray is on the light receiving element, and
   wherein the micro lens has no gap between the adjacent micro lenses.

2. The solid-state image sensor according to claim 1, wherein the maximum film thickness position of the micro lens is away from the central position by 2% or more with respect to a diameter of the micro lens.

3. The solid-state image sensor according to claim 1, wherein the plural pixel sharing structure or a four pixel sharing structure.

4. The solid-state image sensor according to claim 2, wherein the plural pixel sharing structure is a two pixel sharing structure or a four pixel sharing structure.

* * * * *